United States Patent

Palinkas

[11] Patent Number: 5,278,525
[45] Date of Patent: Jan. 11, 1994

[54] ELECTRICAL FILTER WITH MULTIPLE FILTER SECTIONS

[75] Inventor: Raymond W. Palinkas, Canastota, N.Y.

[73] Assignee: John Mezzalingua Assoc. Inc., Manlius, N.Y.

[21] Appl. No.: 897,281

[22] Filed: Jun. 11, 1992

[51] Int. Cl.⁵ .............................................. H03H 7/01
[52] U.S. Cl. ..................................... 333/175; 333/185
[58] Field of Search ............... 333/167, 168, 175, 184, 333/185

[56] References Cited

U.S. PATENT DOCUMENTS

| | | | |
|---|---|---|---|
| 3,065,434 | 11/1962 | Calderhead | 333/167 |
| 3,522,485 | 8/1970 | De Metrick | |
| 3,579,156 | 5/1971 | Parfitt | 333/167 X |
| 4,074,311 | 2/1978 | Tanner et al. | |
| 4,349,795 | 9/1982 | Kwok | 333/176 |
| 4,451,803 | 5/1984 | Holdsworth et al. | 333/12 |
| 4,701,726 | 10/1987 | Holdsworth | 333/185 |
| 4,845,447 | 7/1989 | Holdsworth | 333/167 |
| 4,901,043 | 2/1990 | Palinkas | 333/175 |
| 5,022,078 | 6/1991 | Zelenz | 380/7 |

OTHER PUBLICATIONS

Promotional brochure of Precision Hermetic Technology Inc. (undated, but published no earlier than 1989).

Primary Examiner—Paul Gensler
Attorney, Agent, or Firm—Samuels, Gauthier & Stevens

[57] ABSTRACT

An electrical filter having first and second filter sections with respective sets of electrical filter components. These sets of electrical filter components include primary tuning coils which are arranged parallel to a reference axis. An electrical isolation shield is disposed on a reference plane between the first and second filter sections for electrically isolating the sections from one another, the reference plane being orthogonal to the reference axis. The unique configuration of the filter sections allows for the filter sections to be independently tuned while being physically and electrically isolated from one another. The filter sections are then coupled to one another both physically and electrically subsequent to the tuning operation.

20 Claims, 5 Drawing Sheets

ELECTRICAL FILTER WITH MULTIPLE FILTER SECTIONS

BACKGROUND OF THE INVENTION

The invention relates to a tunable electrical filter with multiple filter sections which may be used in a cable information system.

Conventional tunable filters or cable traps of the kind described are typically referred to as "tuned notch filters" which are utilized for removing frequency scrambling signals provided within, for example, a TV channel band to eliminate reception of that channel. This is referred to as positive trapping in the art. An exemplary scrambling system for cable television signals is described in U.S. Pat. No. 4,074,311 issued to Tanner et al., incorporated herein by reference. These filters may also be utilized for negative trapping, which involves removing specific frequencies within the TV channel band, such as the video carrier, in order to prevent reception of the channel information.

Such tunable notch filters should be capable of approximately 80 dB of attenuation at the center frequency of the notch, and in all cases should be capable of 60 dB at the scramble signal frequency, the notch being sufficiently narrow to prevent serious degradation of the video information. In order to achieve such levels of notch attenuation, conventional filters have been designed with one or more filter sections which are employed in cascade to achieve the high attenuation required. Problems in these designs, however, arose due to the fact that the tuning of one filter section necessarily affects the electrical performance of the other filter sections because of magnetic coupling between the sections, which in turn increases the time required to tune the overall filter in cascade. One such example of a conventional tunable filter with multiple sections is described in U.S. Pat. No. 4,451,803 issued to Holdsworth et al., incorporated herein by reference.

With reference now to FIG. 1, a conventional multi-section tunable filter 10 of the type described above is shown. The filter 10 includes first 11 and second 12 filter sections, each section respectively including circuit boards 13,14 which are magnetically isolated from one another by isolation shields 15,16, and separated by an isolation area IA. A connecting wire CW electrically connects the circuit boards of each section through the isolation area.

According to the filter illustrated, the first filter section 11 includes a female input terminal 17 and a female connector housing 19 connected to the circuit board 13. A primary coil-post assembly 25 and tuning components 27, e.g., capacitors and secondary coils, are provided on the circuit board 13 for tuning the filter section to a desired frequency notch, the primary coils being tuned by adjustment of tuning set screws 29. The assembled circuit board is enclosed by a female cap 21 which is soldered to the first isolation shield 15 at the open end thereof. The female cap includes an externally threaded port 23 for coupling to the information-carrying cable.

Similarly, the second filter section 12 includes a primary coil-post assembly 26, tuning components 28, and a male output terminal pin 18 provided on the circuit board 14. The circuit board 14 is housed within a male cap 22 with an internally threaded port 24. As with the female cap 21, the male cap includes through holes so that an operator may tune the filter section 12 via the primary coils by adjusting the set screws 30. A moisture barrier seal 20a and outer seal 20b are provided about the output terminal pin 18 in order to protect the filter section from moisture or vapor. It will be appreciated that the assembled filter sections 11 and 12 are inserted and sealed within an outer housing sleeve 31.

The use of filters with multiple filter sections requires that each section be magnetically isolated from one another in order to enhance the ease of tuning of the separate sections and to minimize the effects of tuning of one filter section on the tuning of the other. This magnetic isolation is accomplished by providing the isolation area IA between the filter sections, preferably with the use of spaced-apart isolation shields mounted between the filter sections. The isolation area disrupts magnetic fields which might couple the separate filter sections together, thus minimizing the effects of tuning one of the filter sections on the tuning of the other. Specifically, while the magnetic flux emanating from the sides of each coil within a given filter section does not disrupt the tuning characteristics of coils in the same section due to phase cancellation, the side flux emanations tend to disrupt the overall tuning characteristics of the filter if no shields are used.

Due to specified standards defined within the industry, specifically diameter limitations, conventional filter traps have typically been designed with an elongated housing. This elongation is due in part to achieving optimum distances between the tuning coils associated with each filter section. This separation distance is somewhat limited due to the constraints required for the width of the housing, while there are limited constraints on length. Furthermore, the conventional designs require an adequate isolation area, which may be a space between two shields or a relatively thick single shield, in order that the filter sections are properly isolated from one another.

With the number of channels being offered to subscribers continually increasing, it is advantageous to obtain filters of small physical size. Typically, one filter will be used for each channel to be blocked. As the need for more channels to be filtered increases, the number of filters used increases accordingly. This may create problems for cable television systems using enclosures having limited space for housing the filters and other associated equipment. The weight of the filters is also of concern since the equipments used to interface with the filters are normally capable of supporting minimal stress.

Another drawback to the conventional designs of filter traps in the prior art is the fact that typically the filter sections and their associated inner housings are coupled to one another prior to the tuning of each filter section. Therefore, while conventional designs allow for separate tuning of each filter section, the filter sections remain physically tied to one another. This is quite disadvantageous in situations where one of the filter sections is either inoperable or malfunctioning due to unforeseen circumstances. Unfortunately, since the sections are physically coupled to one another prior to the tuning, the entire assembly of both filter sections is unsalvageable. In those filters which have sections that are capable of being tuned separately and then coupled together, there is a further disadvantage in that the coupling configuration does not prevent access to the tuning screws. These screws are typically accessible from the longitudinal periphery of the filter sections when the outer sleeve is removed.

In addition, when filters of this type are deployed for use, they are typically exposed to an outdoor environment and should be self-protective against atmospheric conditions. When there is a fluctuation in temperature, the components housed within the filter expand and contract. Since the components are constructed from dissimilar materials, the coefficients of thermal expansion for these materials are not unified, thus leading to microscopic openings at the filter interface ports. These openings will allow the penetration of water vapor into the filter, thus altering the pre-set resonant frequency, and rendering the filter ineffective for its application.

It is therefore an object of the present invention to provide an electrical filter having a plurality of filter sections with unique component configurations that allow for the reduction of the overall length of the filter.

It is also an object of the present invention to provide an electrical filter having filter sections which are independently tunable and which are coupled to one another subsequent to the tuning process in a manner which prevents access to the tuning screws of each filter section while the sections are coupled to one another.

It is a further object of the present invention to provide an electrical filter which is adequately sealed so as to prevent water vapor from penetrating the insides of the filter.

SUMMARY OF THE INVENTION

In accordance with the present invention, an electrical filter is provided having a first filter section with a first set of electrical filter components and a second filter section having a second set of electrical filter components. The first and second sets of electrical filter components include first and second primary tuning coils arranged parallel to a reference axis. An electrical isolation shield is disposed on a reference plane between the first and second filter sections for electrically isolating the first and second filter sections from one another, the reference plane being orthogonal to the reference axis.

According to another aspect of the present invention, a method for producing a tuned electrical filter is provided, including the steps of providing first and second filter sections, each section respectively having a set of electrical filter components, each set of electrical filter components including primary tuning coils arranged parallel to a reference axis, the first and second filter sections being physically and electrically isolated from one another; tuning each of the first and second filter sections separately to predetermine filter characteristics; and coupling the tuned first and second filter sections to one another both physically and electrically.

DESCRIPTION OF THE ILLUSTRATED EMBODIMENTS

Figure 2:
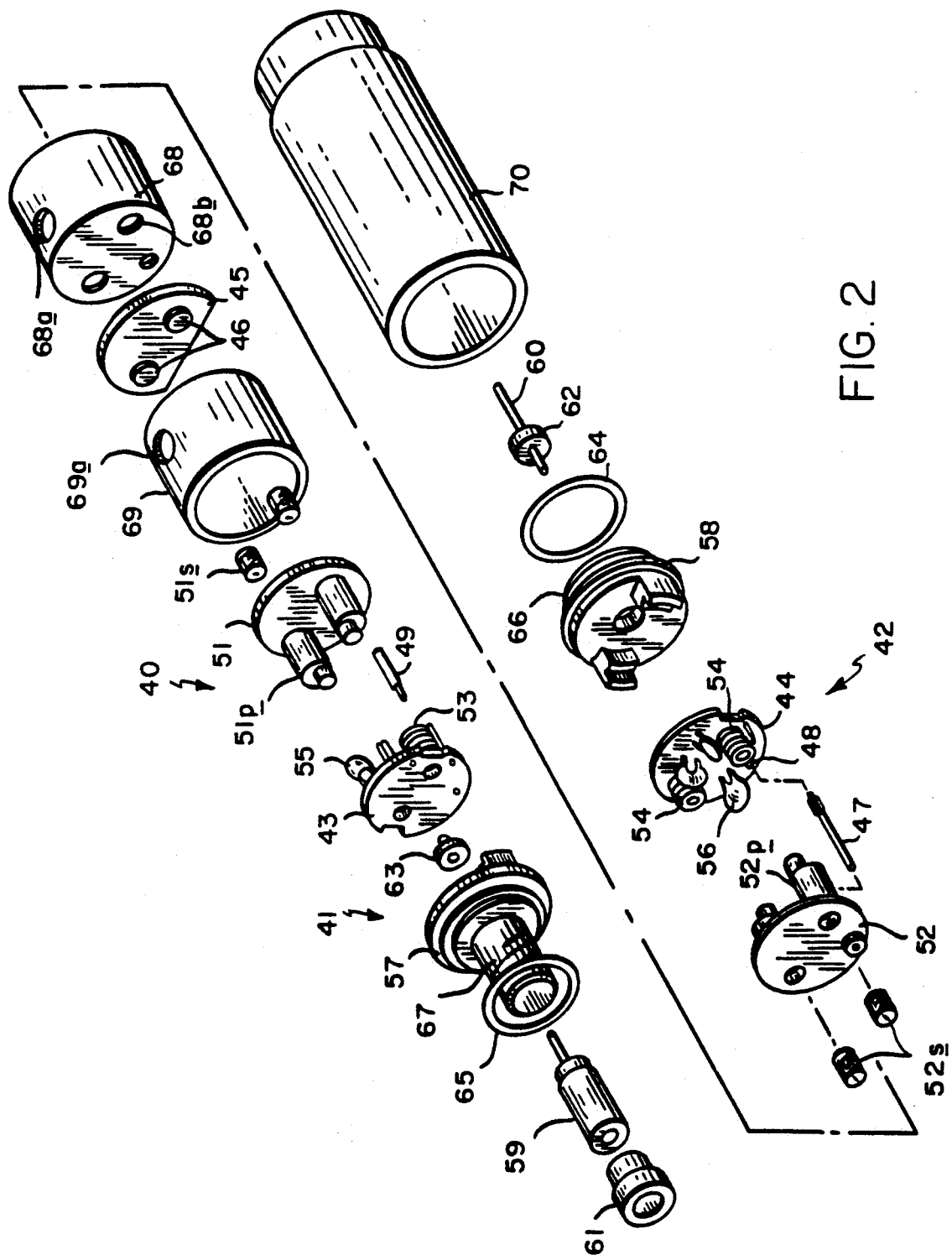
FIG. 2 shows a perspective view of the disassembled components of an electrical filter in accordance with the present invention.
Figure 3:
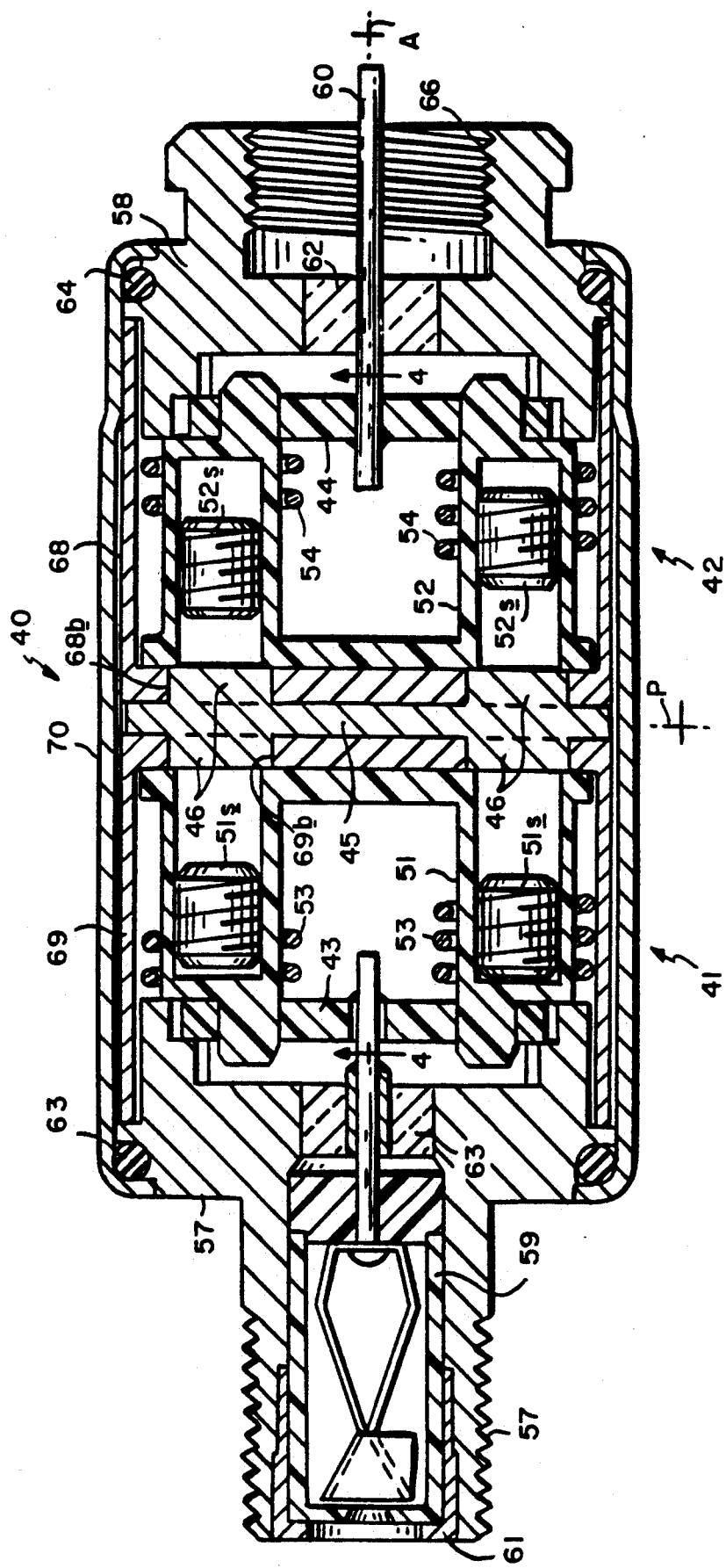
FIG. 3 shows a longitudinal sectional view of the assembled electrical filter trap in accordance with the present invention.
Figure 4:
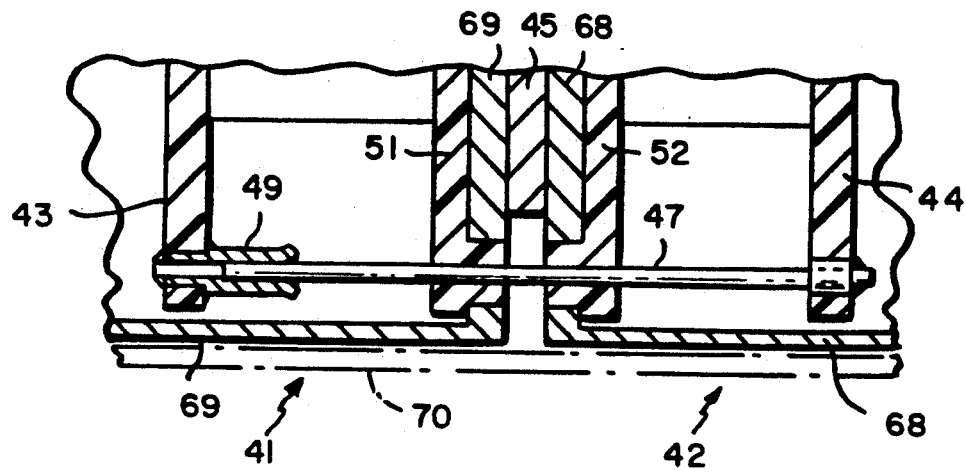
FIG. 4 shows a sectional view taken along the line 4—4 of FIG. 3.

With reference now to FIGS. 2, 3, and 4, an exemplary embodiment of the electrical filter trap 40 of the present invention will be described. The filter 40 generally includes a first filter section 41 and a second filter section 42 separated by an isolation shield 45.

The filter sections 41 and 42 are each provided with circuit boards 43 and 44, respectively. The circuit boards in turn each include pairs of primary tuning coils 53 and 54, respectively, as well as other conventional tuning circuit components 55 and 56. Tuning screw retainer housings 51 and 52 are respectively coupled to the circuit boards 43 and 44 so that screw posts 51p and 52p are positioned within the center of the primary tuning coils 53 and 54. Tuning set screws 51s and 52s are adjustably set within the retaining posts 51p and 52p, respectively, for changing the tuning characteristics of the filter sections. The circuit boards 43 and 44 each further include a connecting pin receiving socket 49 and a connecting pin 47, respectively, which are utilized for electrically coupling the filter sections 41 and 42 to one another as will be described in more detail hereinafter.

Figure 1:
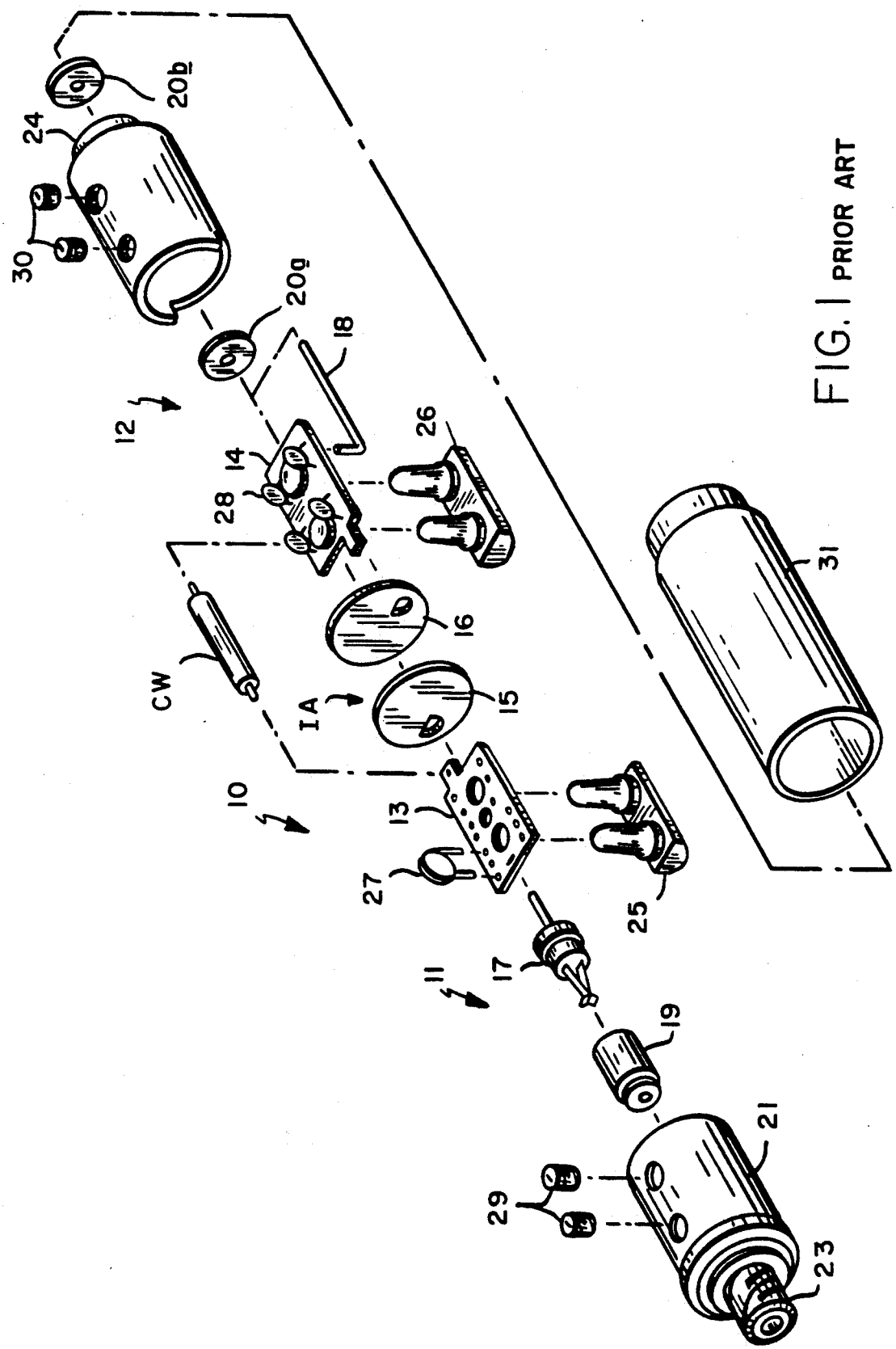
FIG. 1 shows a perspective view of the disassembled components of a prior art electrical filter.

The unique configuration of the circuit boards and the primary tuning coils of each filter section is such that the primary tuning coils are arranged to be parallel to the longitudinal axis A of the overall filter trap 40 by positioning the circuit boards orthogonally with respect to longitudinal axis, while the single thin isolation shield 45 is disposed between the filter sections in a plane P which is also orthogonal to the longitudinal axis. This configuration of the tuning coils provides several beneficial results. With the primary tuning coils arranged parallel to the longitudinal axis of the filter, only the magnetic flux emanating from the top of the coils needs to be shielded from the adjacent filter section. It will be appreciated that the magnitude of the flux emanating from the top of the coils is very small compared to that emanating from the side of the coils, thus the majority of mutual interference caused by these emanations is directed away from the regions at which the filter sections are joined together. Accordingly this configuration allows for the circuit boards of each filter section to be arranged closer to one another. Furthermore, this arrangement requires relatively little or no isolation space between the filter sections and also the requirement for multiple isolation shields is reduced. The overall result of this configuration of components is a reduction of the length of the assembled filter trap 40. The reduction of the filter trap 40 length may be as much as 50% of the length associated with conventional filter traps of the type illustrated in FIG. 1, while maintaining the filtering performance of the conventional elongated traps.

The conventional practices of filter size reduction impose limitations to electrical performance. Since the primary coils are positioned in line with the length of the filter housing, it becomes necessary to decrease the distance between primary coils in order to achieve overall filter length reduction. The proximity of the coils produces a magnetic effect known as mutual coupling. Mutual coupling is a necessary function to the electrical performance of the filter, however, the percentage value is best determined through secondary components, i.e., coupling capacitors and coils. When the distance between the primary coils is reduced, the mutual coupling percentage is increased and cannot be rectified through secondary components. Mutual coupling between inductors in the filter requires precise control in order to develop the desired narrow (sharp) filter attenuation characteristics. High percentage values can produce a filter with undesirable Q characteristics contributing to a wider bandwidth at the −3 dB level. The increased bandwidth has the detrimental effect of attenuating portions of adjacent channels, and noticeably affecting the quality of picture and sound as received by the subscriber.

With the circuit board and coil configuration according to the present invention, size reduction is greatly enhanced. Since the pairs of primary coils and other components on the circuit boards are spaced along the diameter of the filter and not the length of it, the overall filter length is now determined by coil and component heights, not proximity to one another. The inside diameter of the filter is such that the distance between the primary coils is large enough to achieve the desired mutual coupling percentage value.

The circuit boards and associated components of the filter sections 41 and 42 are housed within cup-shaped housings 69 and 68, respectively. The circuit boards 43 and 44 are supported within the housings 69 and 68 by female terminal cap 57 and male terminal cap 58, respectively. The terminal caps 57 and 58 may be attached to the open rim of the housing 69 and 68, respectively, by any conventional bonding method, e.g., gluing or soldering. Once assembled in this manner, the entire space within each of the housings 68 and 69 may be filled with conventional potting compound through openings 68a and 69a, respectively. The potting compound provides a mass which serves to rigidify component mountings on the circuit boards and further to protect the filter from damage caused by shocks, vibrations, or moisture. In addition, the housings 68 and 69 include set screw access openings 68b and 69b which allow an operator access to the tuning set screws 51s and 52s, respectively, during the manufacturing process.

The female terminal end cap 57 includes a female input connector terminal 59 and female connector enclosure 61 which are supported within an externally threaded port 67. The female input connector terminal 59 is connected to the circuit board 43 of the filter section 41. In turn, the male terminal cap 58 includes a male output terminal pin 60, which is connected to the circuit board 44 and supported within an internally threaded port 66.

Figure 6A:
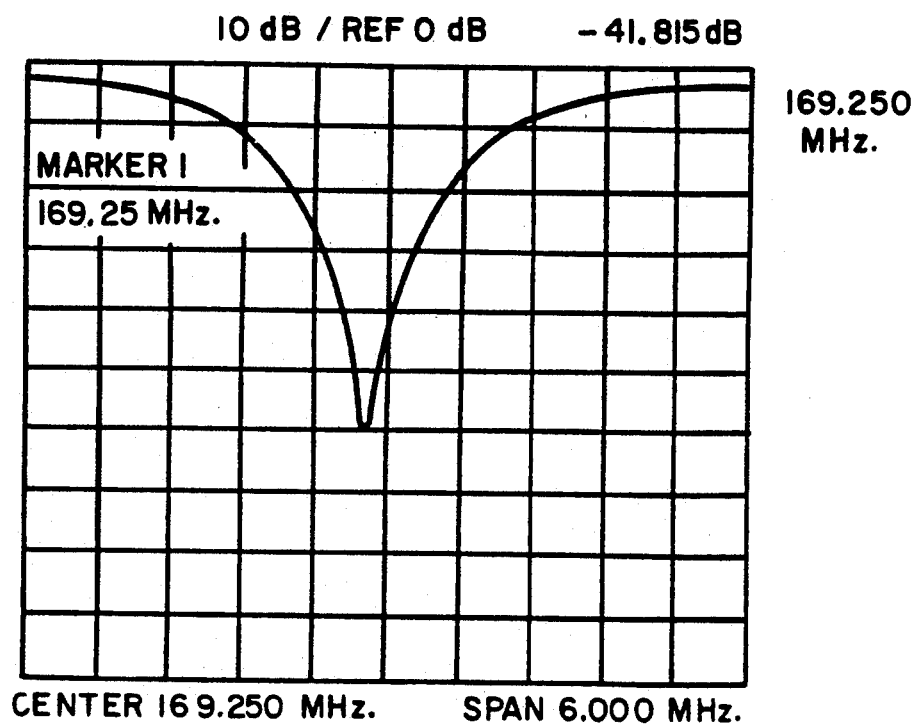
FIG. 6A and 6B show charts of attenuation performance of filters not including and including glass-to-metal seals at terminal interfaces, respectively.
Figure 6B:
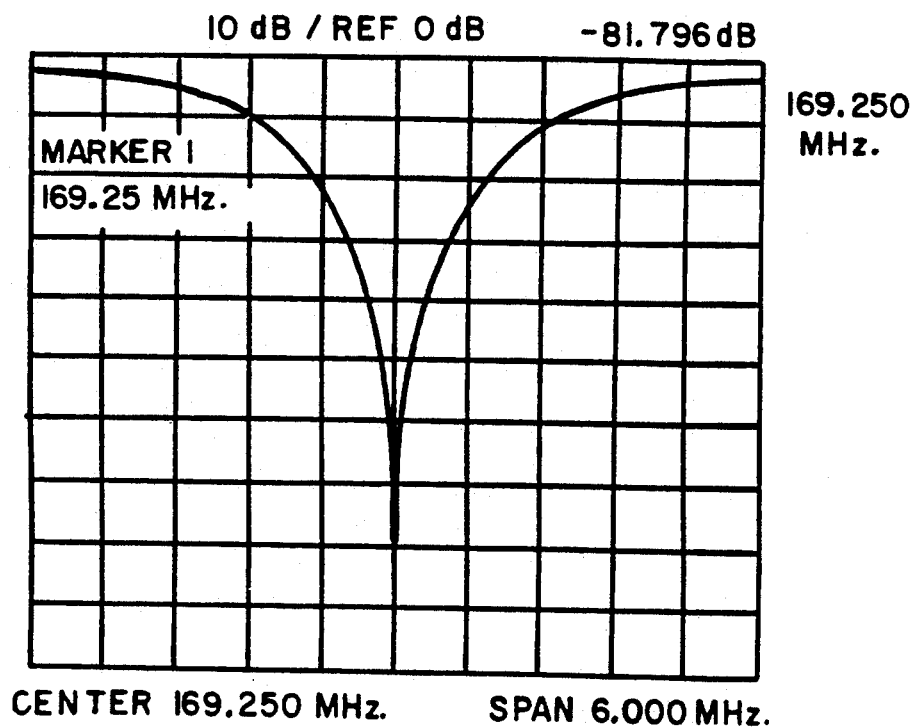

When filters of this type are subjected to extreme environmental conditions, it is inevitable that conventional sealing techniques will allow water vapor to migrate into filter sections. The vapor disturbs the electrical stability of the tuned resonance, causing attenuation at the preset frequency to decrease. FIG. 6A shows the electrical performance characteristic of a filter using current techniques submitted to extreme atmospheric conditions. The attenuation of the filter typically loses integrity and deviates from the desired predetermined frequency. Conventional sealing techniques at the connector interfaces, specifically between the female input connector terminal 59 and the associated circuit board 43, and the male output terminal pins 60 and the associated circuit board 44, do not provide absolute rejection of water vapor transmission, since they rely on adhesion to the associated substrates to remain constant, even though the sealant may be impervious to water vapor. In accordance with the present invention, glass-to-metal seals 62 and 63 are incorporated between the connector interfaces and the interior of the filter sections. To prevent microscopic openings caused by expansion and contraction, two types of glass may be used, either compression or matched glass. A compression glass is that in which the glass constantly exerts pressure to the surrounding components. A matched glass is that in which the glass has identical expansion and contraction characteristics to those of the surrounding materials. FIG. 6B shows an exemplary electrical performance of a filter in accordance with the present invention which utilizes the glass-to-metal seal submitted to extreme atmospheric conditions. The attenuation of the filter retains integrity and remains at the predetermined frequency.

Figure 5A:
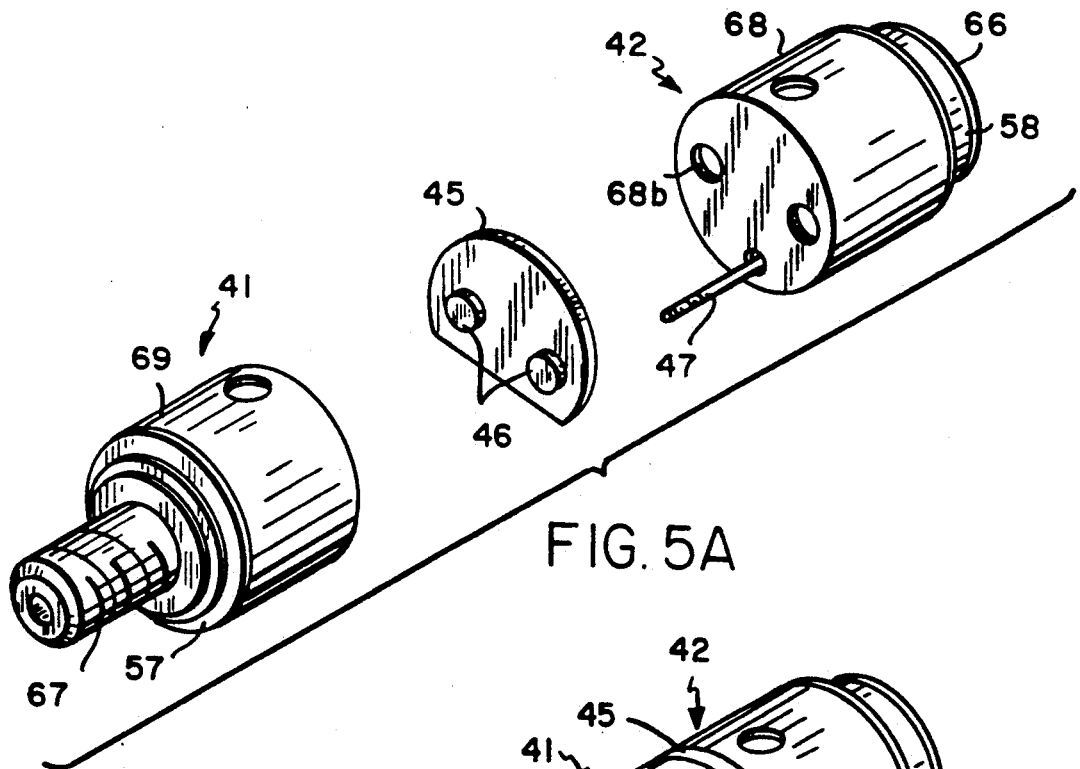
FIG. 5A and 5B show perspective views of first and second filter sections and an isolation shield in accordance with the present invention, in a decoupled state and a coupled state, respectively.
Figure 5B:
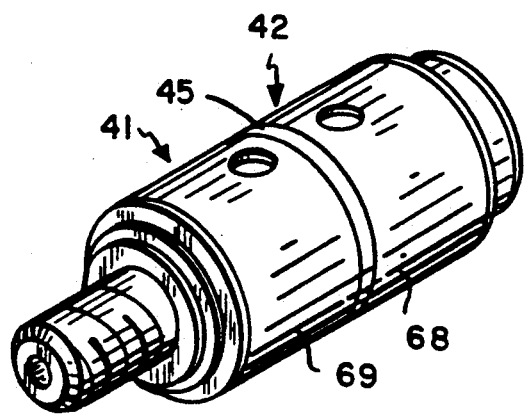

As best illustrated in FIGS. 5A and 5B, the assembled filter sections 41 and 42 are physically separate entities which may be individually tuned. If for some reason one of the sections malfunctions or is inoperable during the manufacturing process, it may be easily replaced with another filter section which operates correctly. Once the filter sections are tuned to the predetermined frequency, the sections are coupled to one another. The sections 41 and 42 are electrically coupled to one another by the insertion of connecting pin 47 into connecting pin socket 49, as shown in FIG. 4. The isolation shield 45 includes alignment protrusions 46 which interactively engage with the set screw access openings 68b of each of the housings 68 and 69. The alignment protrusions 46 serve to both longitudinally align the filter sections 41 and 42 and to stabilize the position of the shield 45 between the filter sections.

The configuration of the present invention also serves to prevent easy access to the tuning set screws 51s and 52s due to their parallel arrangement with the longitudinal axis A of the filter. Once the filter sections 41 and 42 are coupled together the set screw openings 68b are not accessible from the outer periphery of the housings 68 and 69 unless the filter sections are physically separated. Separation of the filter sections in this manner results in discontinuity in the overall filtering characteristics of the filter, thus the filter cannot be accurately tuned to a frequency which will not affect the reception of certain cable channels. If there is an attempt by an unauthorized operator of the filter to separate the filter sections, the connecting pin 47 in all likelihood will sever, thus rendering the filter completely dysfunctional.

The coupled filter sections 41 and 42 are then positioned within and surrounded by a tube sleeve housing 70. A pair of O-rings 64 and 65 are provided respectively between the inner periphery of the tube sleeve housing 70 and the outer periphery of each of the filter sections 41 and 42 in order to prevent water, moisture, and vapor from entering into the interior of the housing.

The foregoing description has been set forth merely illustrate the invention and is not intended to be limiting. Since modifications of the described embodiments incorporating the spirit and substance of the invention may occur to persons skilled in the art, for instance the use of more than two filter sections, the scope of the invention should be limited solely with reference to the appended claims.

What is claimed is:

1. An electrical filter, comprising:
    a first filter section having a first set of electrical filter components, said first set of electrical filter components including a plurality of first primary tunable coils arranged parallel to each other and to a reference axis;
    a second filter section having a second set of electrical filter components, said second set of electrical filter components including a plurality of second primary tunable coils arranged parallel to each other and to said reference axis; and
    an electrical isolation shield disposed on a referenced plane between said first and second filter sections for electrically isolating said first and second filter sections from one another, said reference plane being orthogonal to said reference axis.

2. The filter of claim 1, wherein said first and second sets of electrical filter components are electrically coupled to one another.

3. The filter of claim 2, wherein said first and second filter sections further comprise respective first and second circuit boards for respectively mounting said first and second sets of electrical filter components thereon.

4. The filter of claim 3, wherein said first and second circuit boards are respectively positioned in said first and second filter sections parallel to said reference plane and orthogonal to said reference axis.

5. The filter of claim 4, wherein said first and second filter sections are respectively housed within first and second filter section housings.

6. The filter of claim 5, wherein said first and second filter section housings are cup-shaped having an, open end, a closed end and wall portions.

7. The filter of claim 6, wherein said first and second circuit boards are respectively supported within said first and second filter section housings so as to be parallel with said respective closed ends, said primary tunable coils being accessible through openings in said respective closed ends.

8. The filter of claim 7, wherein said first and second filter section housings are coupled to one another at their respective closed ends.

9. The filter of claim 8, wherein said isolation shield is disposed between said respective closed ends of said first and second filter section housing means.

10. The filter of claim 9, wherein said isolation shield comprises protrusions which engage with said openings of said respective closed ends for aligning said first and second filter housings along said reference axis.

11. The filter of claim 10 further comprising first and second terminal ports disposed at said respective open ends of said first and second filter section housings, and coupled respectively to said first and second sets of electrical filter components.

12. The filter of claim 11, wherein said first and second filter section housings are housed within a cylindrical sleeve.

13. The filter of claim 11, wherein glass-to-metal hermetic seals are utilized in association with said first and second terminal ports.

14. The filter of claim 1, wherein said first and second filter sections are physically separate units.

15. The filter of claim 14, wherein said first and second filter sections further comprise first and second filter housings in which said first and second filter components are respectively supported.

16. The filter of claim 15, wherein said first and second filter sections further comprise first and second circuit boards on which said first and second sets of filter components are respectively mounted.

17. The filter of claim 16, wherein said first and second filter sections are electrically coupled to each other subsequent to each section being separately tuned.

18. The filter of claim 17, wherein said isolation shield is positioned between said first and second filter sections.

19. The filter of claim 18, wherein said isolation shield further comprises aligning members which serve to align said first and second filter sections along said reference axis.

20. A method for producing a tuned electrical filter, comprising the steps of:
    providing first and second filter sections, each section respectively having a set of electrical filter components, each set of electrical filter components respectively including a plurality of primary tunable coils respectively arranged parallel to each other and to the longitudinal axis of said filter, said first and second filter sections being physically and electrically isolated from one another;
    tuning each of said first and second filter sections separately to predetermined filter characteristics; and
    coupling said tuned first and second filter sections to one another both physically and electrically.

* * * * *